US009142543B2

(12) United States Patent
Katakura et al.

(10) Patent No.: US 9,142,543 B2
(45) Date of Patent: Sep. 22, 2015

(54) SEMICONDUCTOR DEVICE HAVING AN ESD PROTECTION CIRCUIT

(71) Applicant: SEIKO INSTRUMENTS INC., Chiba (JP)

(72) Inventors: Takashi Katakura, Chiba (JP); Hirofumi Harada, Chiba (JP); Yoshitsugu Hirose, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/172,217

(22) Filed: Feb. 4, 2014

(65) Prior Publication Data

US 2014/0217511 A1    Aug. 7, 2014

(30) Foreign Application Priority Data

Feb. 6, 2013  (JP) .................. 2013-021626
Dec. 9, 2013  (JP) .................. 2013-254351

(51) Int. Cl.
*H01L 27/02*    (2006.01)

(52) U.S. Cl.
CPC ........ *H01L 27/0255* (2013.01); *H01L 27/0266* (2013.01); *H01L 27/0274* (2013.01); *H01L 27/0288* (2013.01)

(58) Field of Classification Search
CPC ............ H01L 27/0255; H01L 27/0266; H01L 27/0274; H01L 27/0288
See application file for complete search history.

(56) References Cited

U.S. PATENT DOCUMENTS

| | | | | |
|---|---|---|---|---|
| 5,237,395 A | * | 8/1993 | Lee | ................................ 257/358 |
| 6,912,109 B1 | * | 6/2005 | Ker et al. | ........................ 361/56 |
| 2005/0018370 A1 | * | 1/2005 | Arai et al. | ........................ 361/56 |
| 2010/0053827 A1 | * | 3/2010 | Kawano | ........................ 361/56 |
| 2011/0133282 A1 | * | 6/2011 | Okushima | ..................... 257/358 |

FOREIGN PATENT DOCUMENTS

| | | |
|---|---|---|
| EP | 2540503 | 1/2003 |
| EP | 2316649 | 5/2011 |
| EP | 2322347 | 5/2011 |
| EP | 2540504 | 1/2013 |
| JP | 2009196122 | 9/2009 |
| WO | 2007113554 | 10/2007 |

OTHER PUBLICATIONS

Patent Abstracts of Japan, Publication No. 11-121750, Publication Date Apr. 30, 1999.
IPO Search Report mailed May 7, 2014 issued in Appln. No. GB1319598.7.

* cited by examiner

*Primary Examiner* — William Coleman
(74) *Attorney, Agent, or Firm* — Adams & Wilks

(57) ABSTRACT

An ESD protection circuit having a smaller area is provided. The ESD protection circuit includes: a P-type diffusion resistor 12 whose one end is connected to an input terminal 11 formed in the N-type well; a diode 14 disposed between the diffusion resistor 12 and the N-type well connected to the power supply terminal; an NMOS transistor 15 whose drain is connected to the other end of the diffusion resistor 12; and a parasitic diode formed between the power supply terminal and the ground terminal.

9 Claims, 6 Drawing Sheets

SEMICONDUCTOR DEVICE HAVING AN ESD PROTECTION CIRCUIT

BACKGROUND OF THE INVENTION

1. Field of the Invention

The present invention relates to a semiconductor device, in particular, to an ESD protection circuit for protecting an input terminal of a semiconductor device.

2. Description of the Related Art

An example for an ESD protection circuit of a conventional semiconductor device is given and explained. FIG. 5 is a circuit diagram showing an ESD protection circuit for an input terminal of a conventional semiconductor device.

The resistors 92 and 93 serially connected to the input terminal 91 slow down the propagation of a surge from the input terminal 11 to the internal circuit, and prevent the flow of rush current into the internal circuit. The PMOS transistor 94 and the NMOS transistor 95, which are normally off, discharge the excess current to the power supply terminal or to the ground terminal respectively through the avalanche breakdown of the PN junction at the drain when the surge invades from the input terminal 91, protecting the internal circuit from the excess current generated by the surge (see, for example, Japanese Published Patent Application H11-121750).

In the conventional protection circuit a PMOS transistor or an NMOS transistor having an area large enough to flow a large current caused by the surge has to be arranged for each input terminal between the power supply terminal and input terminal or between the ground terminal and the input terminal, respectively, which sometimes becomes an obstacle in scaling down the IC chip area of the semiconductor device.

SUMMARY OF THE INVENTION

The present invention has been made in view of the above-mentioned problem, and provides a semiconductor device having an ESD protection circuit with a smaller area.

In order to solve the above-mentioned problem, according to one embodiment of the present invention, there is provided a semiconductor device including: a P-type semiconductor substrate; an N-type well disposed on the semiconductor substrate and connected to a power supply terminal; a P-type diffusion resistor disposed in the well and having one end connected to an input terminal, a parasitic diode formed between the well and the diffusion resistor; a first NMOS transistor having a gate and a source both connected to a ground terminal and having a drain connected to another end of the diffusion resistor; and a second NMOS transistor disposed between the power supply terminal and the ground terminal, and having a gate connected to the ground terminal; wherein electrons charged in the gate of the first NMOS transistor are pulled out from the input terminal through the second NMOS transistor and the parasitic diode.

According to the present invention, the area of a semiconductor device can be made smaller to the extent that a diode is arranged on the side of the power supply terminal after omitting a conventionally used PMOS transistor in an ESD protection circuit for an input terminal.

DETAILED DESCRIPTION OF THE INVENTION

Now, embodiments of the present invention are described with reference to the accompanying drawings.

First Embodiment

Figure 1:
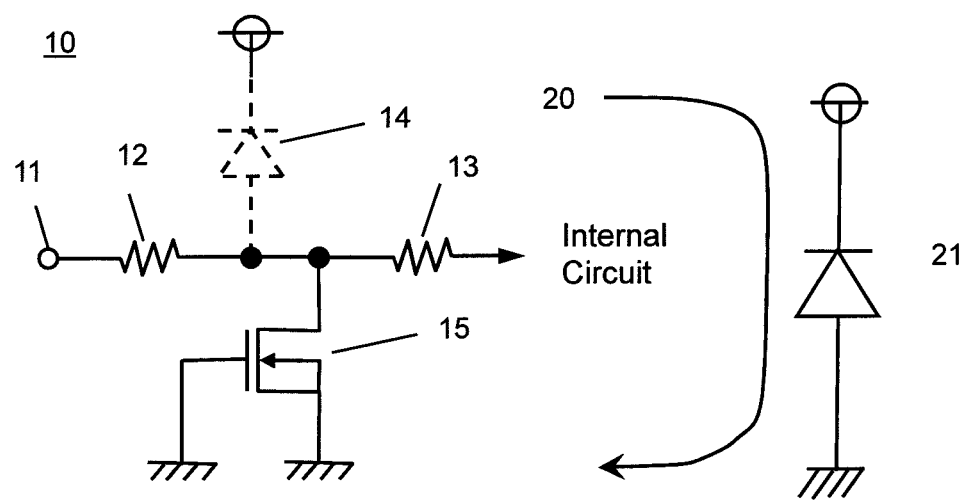
FIG. 1 is a circuit diagram showing a semiconductor device having an ESD protection circuit.
Figure 2A:
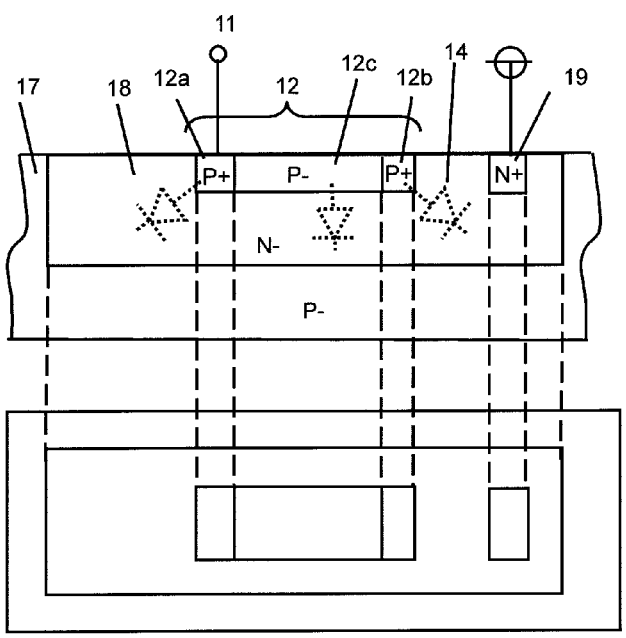
FIG. 2A is a schematic sectional view of a resistor and a parasitic diode.
Figure 2B:
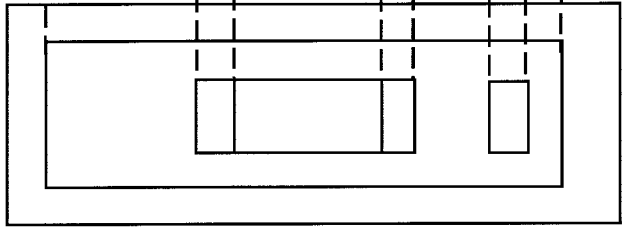
FIG. 2B is a schematic plan view of a resistor and a parasitic diode.

First, a structure of an ESD circuit for an input terminal is explained. FIG. 1 shows an equivalent circuit for an ESD protection circuit. FIGS. 2A and 2B show a resistor and a parasitically formed diode of FIG. 1, in which FIG. 2A is a schematic sectional view and FIG. 2B is a schematic plan view.

An ESD protection circuit 10 arranged for an input terminal 11 has a P-type diffusion resistor 12, a resistor 13, a diode 14, and an NMOS transistor 15. As shown in FIGS. 2A and 2B one end of the P-type diffusion resistor 12 arranged in an N-type well 18 formed on a P-type semiconductor substrate is connected to the input terminal 11. The N-type well 18 is connected to the power supply terminal. In the diode 14 an anode is connected to the diffusion resistor 12 and a cathode is connected to the power supplying terminal. The diode 14 is formed between the N-type well 18 and the P-type diffusion resistor 12 in FIG. 2A and is connected in the reverse direction to the power supply terminal.

The gate and the source of the NMOS transistor 15 are connected to the ground terminal, the back gate is also connected to the ground terminal, and the drain is connected to the other end of the diffusion resistor 12. One end of the resistor 13 is connected to the other end of the diffusion resistor 12 and the other end of the resistor 13 is connected to an internal circuit. Here the diode 14 is not a definite single diode as shown in the equivalent circuit of FIG. 1 since the diode 14 is formed parasitically between the diffusion resistor 12 and the N-type well 18. The important point is that the diode 14 disposed between the power supply terminal and the input terminal is arranged closer to the input terminal than the drain of the NMOS transistor 15. The arrangement is necessary to establish a current path 20 through the diode 14 disposed between the input terminal and the power supply terminal and also through the diode 21 whose cathode is connected to the power supplying terminal and whose anode is connected to the ground terminal, and formed in the P-type semiconductor substrate, during the current is stranded by the diffusion resistor 12 and the parasitic capacitance.

An N-type diffusion region 19 is formed in the N-type well 18 which is formed on the surface of the P-type semiconductor substrate 17. The N-type diffusion region 19 is connected to the power supplying terminal. The diffusion resistor 12 formed of a P-type low-concentration diffusion region 12c and P-type high-concentration diffusion regions 12a and 12b is arranged in the N-type well 18. An input terminal 11 is connected to the diffusion region 12a which is one end of the diffusion resistor 12. In this embodiment the N-type diffusion region 19 for providing a contact to the N-type well 18 is only arranged in the vicinity of the diffusion region 12b which is the other end of the diffusion resistor 12.

Next, an explanation is given to an characteristic operation for ESD protection in this circuit.

A test method for a measurement of immunity (strength) against ESD, in which electrons, which have negative charge and have been accumulated and charged in the capacitances of the semiconductor substrate, the gate oxide, and the like in the semiconductor device, are pulled out (or filled in as a sense of current direction) all at once from a selected terminal is called CDM (Charged Device Model) test. If the diode 14 is absent in this test, current flows into a substrate region of the NMOS transistor 15, and momentarily generates a voltage difference between the gate electrode and the substrate, leading to a possible destruction of the NMOS transistor. The reason for the generation of the voltage difference is thought to be that the absence of the path 20 beginning from the input terminal to the ground terminal through the diode 14, the power supply terminal, and the diode 21, through which the electrons accumulated in the gate of the NMOS transistor 15 are pulled out, generates the voltage difference between the gate electrode and the substrate both of which have essentially the same voltage. It should be noted that the reverse current flows through the diode 21, not the forward current. As shown above the presence of the path 20 between the input terminal and the ground terminal is essential, and the diode 14 and the diode 21 play an indispensable role.

Resistors 12 and 13 slow down the propagation of a surge from the input terminal 11 to the internal circuit, and prevent the rush current into the internal circuit. The diode 14 and the NMOS transistor 15, which are normally off, discharge the charges accumulated in the semiconductor substrate and the gate to the input terminal by the avalanche breakdown of the PN junction at the drain of the NMOS transistor 15 and by the construction of the path 20 through the diode 14, protecting the internal circuit from the excess current generated by the surge.

Figure 3A:
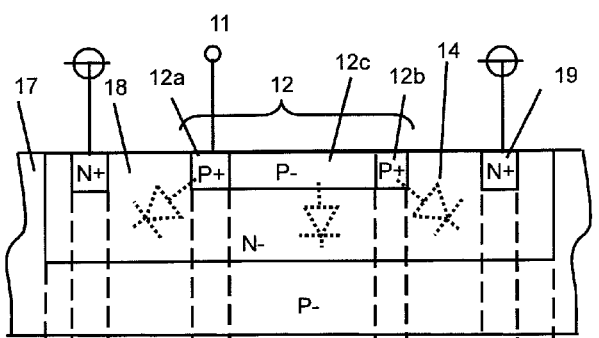
FIG. 3A is a schematic sectional view of another resistor and another parasitic diode.
Figure 3B:
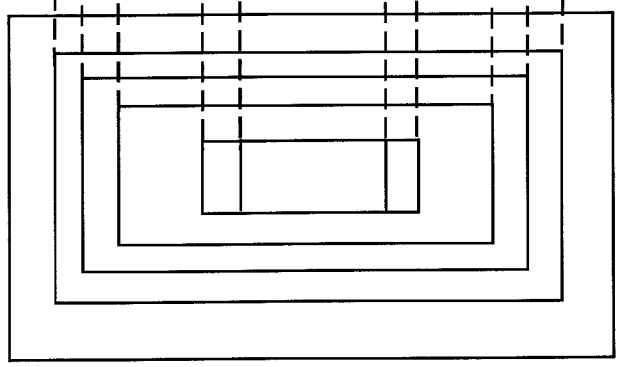
FIG. 3B is a schematic plan view of another resistor and another parasitic diode.

As shown in FIGS. 3A and 3B, the N-type diffusion region 19 can be formed to surround the diffusion region 12.

The diode 14 can be a non-parasitic origin instead of a parasitic diode generated in the diffusion resistor 12, and can be arranged on an input path closer to the input terminal 11 than the resistor 12.

Second Embodiment

Figure 4:
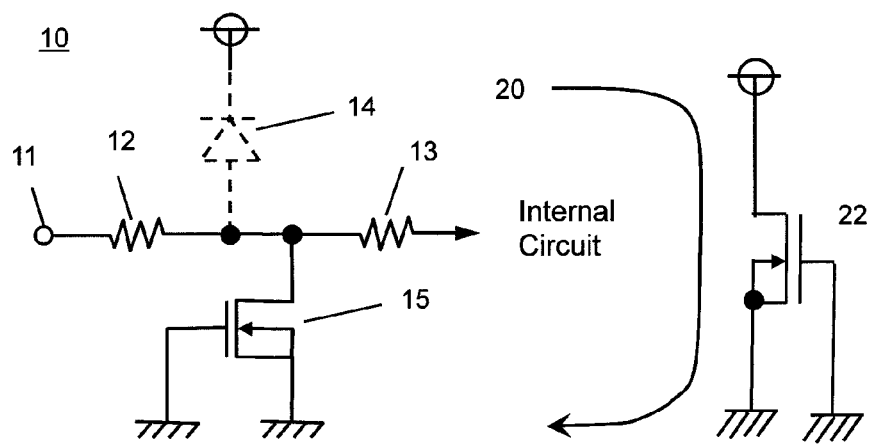
FIG. 4 is a circuit diagram showing a semiconductor device having another ESD protection circuit.
Figure 5:
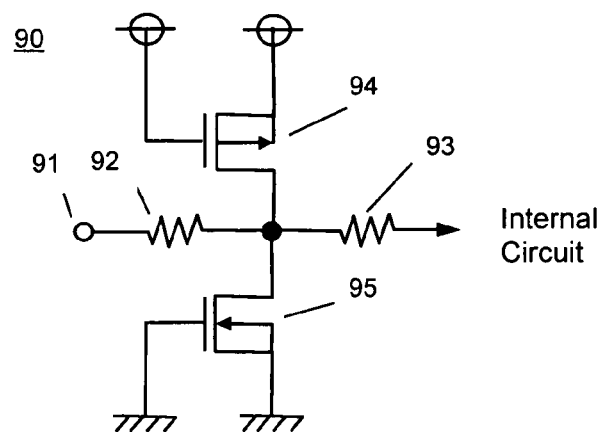
FIG. 5 is a circuit diagram showing a conventional ESD protection circuit.

FIG. 4 shows an equivalent circuit for the second embodiment which differs from the first embodiment at the point where a protection device between the power supplying terminal and the ground terminal is an NMOS transistor 22, whose gate is grounded to turn off, and which is formed on the P-type semiconductor substrate. Since the NMOS transistor 22 has the gate which is connected to the ground, the breakdown voltage thereof can be made lower than that of the diode constructed from the same impurity concentrations. The operation of the protection circuit is similar to that of the first embodiment; the breakdown of the junction between the drain and the semiconductor substrate activates the formation of the current path 20.

Third Embodiment

Figure 6:
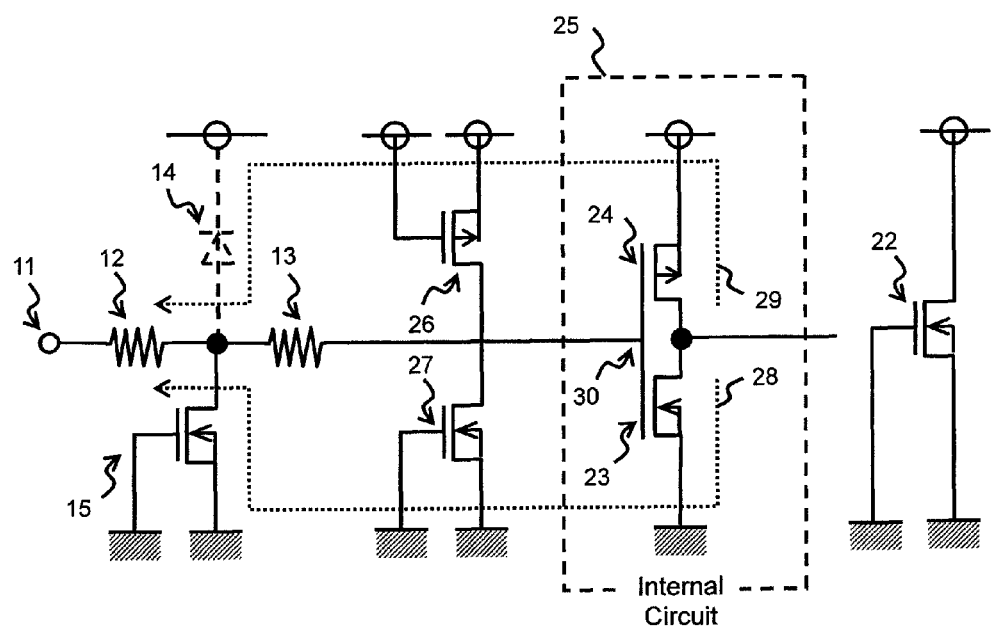
FIG. 6 is a circuit diagram showing a semiconductor device having still another ESD protection circuit.

FIG. 6 shows an equivalent circuit for the third embodiment. Basic configuration is almost the same as that of the first embodiment. The difference is a specific illustration of the construction of the internal circuit connected to the resistor 13.

The internal circuit illustrated in FIG. 6 includes a typical inverter circuit 25 in which the drain of the NMOS transistor 23 and the drain of the PMOS transistor 24 are mutually connected. In the inverter circuit 25 the common gate terminal 30 is connected to the input terminal via the resistor 13. Without the diode 14 the configuration shown in the third embodiment has a weak immunity (strength) in the CDM test. The benefit of the present invention can be more effectively shown in this configuration. The reason is that the discharge route is limited to the NMOS transistor 15.

In the CDM test carried out for the input terminal 11 charges accumulated in the IC chip is discharged through the discharge route 28. At a glance there seems to exist another route which reaches to the input terminal 11 through the protection diode 27, which is an NMOS transistor whose gate is connected to the ground, and through the resistor 13. The other discharge route, however, is obstructed by the resistor 13, and does not work actually. As explained above all the charges accumulated in the IC chip are collected to the discharge route 28 through the NMOS transistor 15, generating the voltage difference between the gate and the semiconductor substrate, which leads to a dielectric breakdown.

In the present invention the configuration in which the diffusion resistance 12 and the parasitic diode 14 are implemented completes a discharge route 29, resulting in the separated discharge through the discharge routes 28 and 29. Accordingly another discharge route except the route through the NMOS transistor 15 can be secured and the ESD immunity (strength) under the CDM test can also be increased.

As a conventional protection measure for the CDM test, it is well know to have protection diodes 26 and 27, a PMOS transistor whose gate is connected to the power supply terminal and an NMOS transistor whose gate is connected to the ground terminal, on the input terminal as shown in FIG. 6. The insertion of the protection diodes suppresses the occurrence of the voltage difference between the gate and the substrate, increasing the immunity against the CDM test. The protection caused by the conventional measure, however, only covers the gate portion of the NMOS transistor and the PMOS transistor constructing the inverter circuit 25. Since the presence of the resistor 13 disables the protection of the NMOS transistor 15 through the protection diodes 26 and 27, the present embodiment gives a greater benefit.

What is claimed is:

1. A semiconductor device having an ESD protection circuit, comprising:
a P-type semiconductor substrate;
an N-type well disposed on the P-type semiconductor substrate;
a P-type diffusion resistor disposed in the N-type well;
a diode formed between the N-type well and the P-type diffusion resistor;
a first NMOS transistor and a second NMOS transistor disposed on the P-type semiconductor substrate;
a ground terminal disposed on the P-type semiconductor substrate; and
a power supply terminal disposed on the N-type well;
wherein one end of the P-type diffusion resistor is connected to an input terminal, and another end of the P-type diffusion resistor is connected to a drain of the first NMOS transistor and further connected to an internal circuit;
wherein a gate and a source of the first NMOS transistor are connected to the ground terminal; and wherein a drain of the second NMOS transistor is connected to the power supply terminal, and a gate and a source of the second NMOS transistor are connected to the ground terminal.

2. A semiconductor device according to claim 1, wherein: electrons charged in the gate of the first NMOS transistor are pulled out from the input terminal through the second NMOS transistor and the diode.

3. A semiconductor device according to claim 1, further comprising:
a resistor disposed between the diffusion resistor and the internal circuit, the resistor having one end connected to the other end of the diffusion resistor and having another end connected to the internal circuit.

4. A semiconductor device according to claim 1, wherein: the power supply terminal comprises an N-type diffusion region disposed only in the vicinity of the other end of the diffusion resistor.

5. A semiconductor device according to claim 1, wherein: the power supply terminal comprises an N-type diffusion region disposed around the diffusion resistor.

6. A semiconductor device according to claim 1, wherein: the internal circuit has a second input terminal, the second input terminal being a common gate electrode of an inverter circuit.

7. A semiconductor device having an ESD protection circuit, comprising:
a P-type semiconductor substrate;
an N-type well disposed on the P-type semiconductor substrate;
a P-type diffusion resistor disposed in the N-type well;
a first diode formed between the N-type well and the P-type diffusion resistor;
an NMOS transistor and a second diode disposed on the P-type semiconductor substrate;
a ground terminal disposed on the P-type semiconductor substrate; and
a power supply terminal disposed on the N-type well;
wherein one end of the P-type diffusion resistor is connected to an input terminal, and another end of the P-type diffusion resistor is connected to a drain of the NMOS transistor and further connected to an internal circuit;
wherein a gate and a source of the NMOS transistor are connected to the ground terminal; and
wherein a cathode of the second diode is connected to the power supply terminal, and an anode of the second diode is connected to the ground terminal.

8. A semiconductor device according to claim 7, wherein: electrons charged in the gate of the NMOS transistor are pulled out from the input terminal through the first diode and the second diode.

9. A semiconductor device according to claim 7, wherein: the internal circuit has a second input terminal, the second input terminal being a common gate electrode of an inverter circuit.

* * * * *